United States Patent
Lee et al.

[11] Patent Number: 5,998,870
[45] Date of Patent: Dec. 7, 1999

[54] WIRING STRUCTURE OF SEMICONDUCTOR DEVICE AND METHOD FOR MANUFACTURING THE SAME

[75] Inventors: Sang-in Lee, Suwon; Sun-ho Ha, Seoul, both of Rep. of Korea

[73] Assignee: Samsung Electronics Co., Ltd., Kyungki-do, Rep. of Korea

[21] Appl. No.: 08/873,869

[22] Filed: Jun. 12, 1997

Related U.S. Application Data

[63] Continuation of application No. 08/476,111, Jun. 7, 1995, abandoned.

[30] Foreign Application Priority Data

Jun. 10, 1994 [KR] Rep. of Korea ............... 94-13121

[51] Int. Cl.$^6$ .................... H01L 23/532; H01L 21/44
[52] U.S. Cl. ................ 257/751; 257/915; 438/685; 438/677; 438/648
[58] Field of Search ........................... 438/688, 685, 438/677, 648, 658; 257/751, 915

[56] References Cited

U.S. PATENT DOCUMENTS

| | | |
|---|---|---|
| 4,994,410 | 2/1991 | Sun et al. . |
| 5,151,305 | 9/1992 | Matsumoto et al. ............ 427/252 |
| 5,171,412 | 12/1992 | Talieh et al. . |
| 5,232,871 | 8/1993 | Ho . |
| 5,290,731 | 3/1994 | Sugano et al. . |
| 5,296,404 | 3/1994 | Akahori et al. . |
| 5,508,066 | 4/1996 | Akahori ........................ 427/571 |
| 5,685,960 | 11/1997 | Fu et al. . |

FOREIGN PATENT DOCUMENTS

| | | |
|---|---|---|
| 0545602A1 | 11/1992 | European Pat. Off. . |
| 5-36664 | 4/1993 | European Pat. Off. . |
| 61-183942 | 8/1986 | Japan . |
| 63-303062 | 12/1988 | Japan . |
| 4-267359 | 9/1992 | Japan . |
| 5-311393 | 11/1993 | Japan . |
| 2279498 | 1/1995 | United Kingdom . |

*Primary Examiner*—Caridad Everhart
*Attorney, Agent, or Firm*—Pillsbury Madison & Sutro, LLP

[57] ABSTRACT

A wiring structure of a semiconductor device buries an aperture, for example, a contact hole or via hole. The wiring structure includes a semiconductor substrate, an insulating layer formed on the semiconductor substrate and having an aperture formed therein, a diffusion barrier film formed on the inner sidewalls of the aperture and which has a smooth surface without having grain boundaries made of a refractory metal or refractory metal compound, and a metal layer formed on the diffusion barrier film. The metal layer formed on the smooth sidewalls of the diffusion barrier film is made of a uniformly and continuously formed aluminum film having an excellent step coverage. Accordingly, the method for forming the wiring structure effectively buries a contact hole having a high aspect ratio and enhances the reliability of a manufactured device.

33 Claims, 9 Drawing Sheets

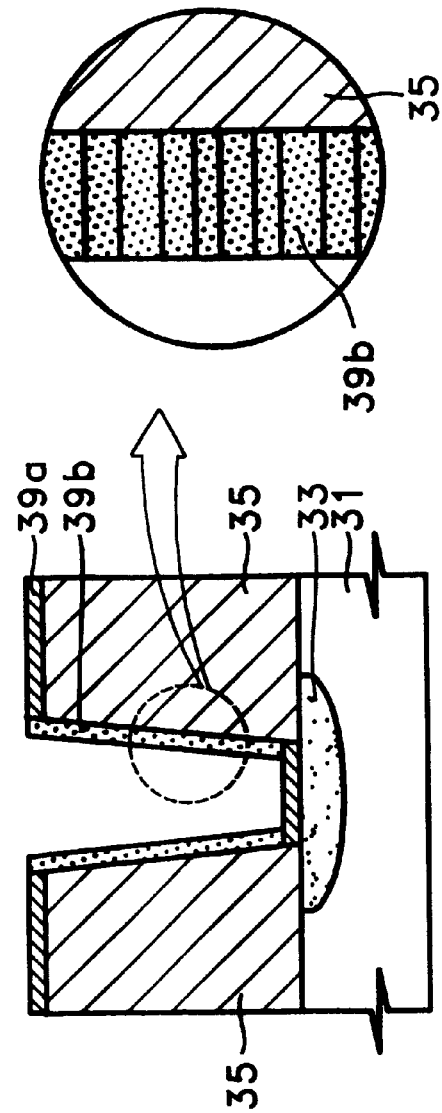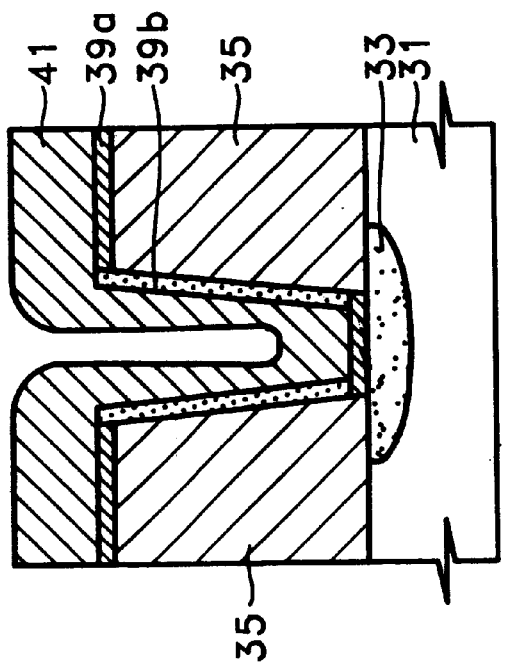

FIG. 9A1
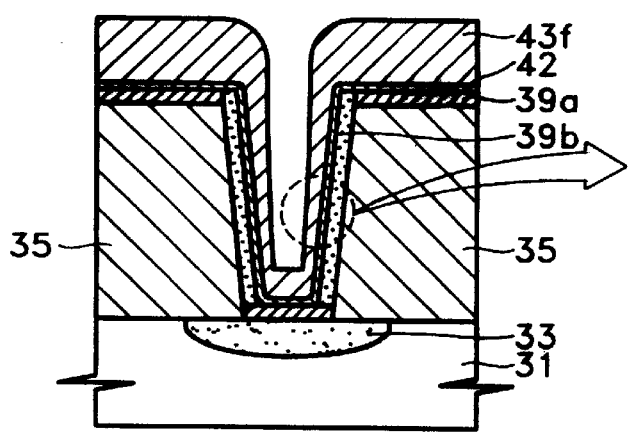
FIG. 9A2
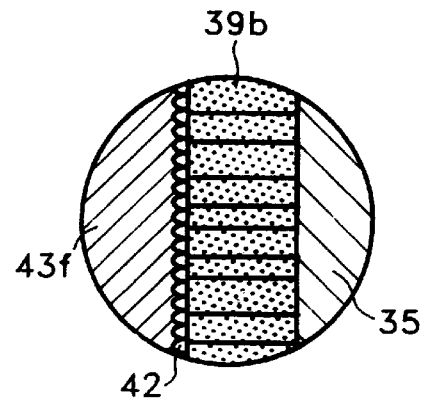
FIG. 9B
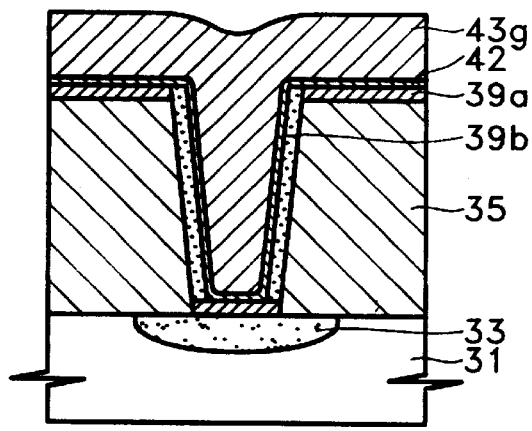
FIG. 9C
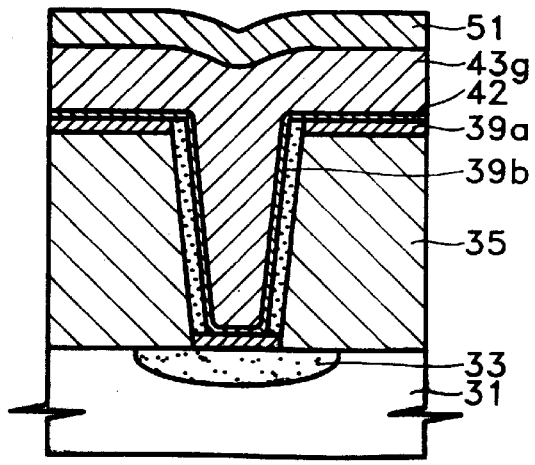

WIRING STRUCTURE OF SEMICONDUCTOR DEVICE AND METHOD FOR MANUFACTURING THE SAME

This is a Continuation of National Appln. Ser. No. 08/476,111 filed Jun. 7, 1995, now abandoned.

BACKGROUND OF THE INVENTION

The present invention relates to a method for manufacturing a semiconductor device, and more particularly, to a wiring structure of a semiconductor device for burying an aperture such as a contact hole or a via hole and a method for manufacturing the same.

Generally speaking, the most crucial part in the manufacturing process of a semiconductor device is the wiring, because the operating speed, yield and reliability of the device are all determined by the wiring method. The step coverage of a metal layer is not a significant problem in a conventional semiconductor device having low integration. However, recently, higher integration levels have resulted in extremely small contact holes (i.e., diameters of one half micron or less) and very thin impurity injection regions in the semiconductor substrate. Using conventional aluminum wiring methods, it is difficult to fill a contact hole smaller than 1 $\mu$m, and a void is often formed in the contact hole, and which lowers the reliability of the metal wiring layer.

In an early stage of manufacturing a semiconductor device, a metal wiring layer is formed on a silicon substrate by using pure aluminum. However, as temperature increases in a subsequent sintering stage, the formed aluminum layer absorbs silicon atoms from the substrate, which generates junction (Al) spiking. Therefore, Al-1% Si (aluminum supersaturated with silicon) has been widely used as the material of the metal wiring layer.

However, when the wiring of a semiconductor device is formed using Al-1% Si, silicon is extracted from the aluminum film during heat treatment at a temperature exceeding 450° C., thus forming a silicon residue. In addition, a Si-nodule is formed in a contact hole through the solid-phase epitaxial growth of silicon atoms, to thereby increase the wiring resistance and contact resistance.

To prevent the above Al spiking, the generation of silicon residue and the Si-nodule due to an interaction between a metal wire layer and a silicon substrate, a diffusion barrier film is formed between the wiring layer and silicon substrate or between the wiring layer and an insulating layer. For example, a method for forming a titanium nitride (TiN) film as a diffusion barrier film on an inner wall of a contact hole is disclosed in U.S. Pat. No. 4,897,709 by Yokoyama et al. In addition, a technique where a double film consisting of a refractory metal (Ti) film and a TiN film is formed and heat-treated as a diffusion barrier layer, and a titanium (Ti) layer interacts with a semiconductor substrate to thus form a refractory metal silicide layer consisting of thermally stable compounds in the bottom of a contact hole connected to the semiconductor substrate, to thereby enhance a barrier effect, is disclosed in Japanese Laid-open Publication No. 61-183942. In general, such a diffusion barrier film is annealed in a nitrogen atmosphere. If the diffusion barrier film is not annealed, junction spiking occurs when aluminum or an aluminum alloy is sputtered at a temperature exceeding 450° C. or when sintering is performed, which is not desirable. In addition, a TiN or TiW film is employed as the diffusion barrier film. A microstructural defect that cannot completely prevent the diffusion of aluminum or silicon at a grain boundary exists in the TiN or TiW film.

In addition, a method for blocking a diffusion path at a grain boundary by employing an oxygen stuffing method has been proposed (see: pp375–382 of "Effects of Oxygen on Reactively Sputtered TiN Films" by J. B. Stimmel and B. N. Mehrotra, in *Tungsten and Other Refractory Metals for VLSI Application III*, 1988). In general, when TiN is deposited and exposed to the ambient atmosphere, the exposed TiN is mixed with a small amount of oxygen in the atmosphere, to thereby increase a diffusion barrier effect. This is called a stuffing effect. In more detail, Stimmel and Mehrotra teach that oxygen exists in oxide form at a surface of barrier metal and at a grain boundary as well, which explains a stuffing effect.

However, a contact resistance may increase if a barrier layer formed by depositing Ti or TiN is exposed to the atmosphere, or if the TiN is deposited by mixing with oxygen, or if TiN is annealed at a nitrogen atmosphere mixed with oxygen. Accordingly, the barrier characteristic of a TiN film changes depending on the duration of atmospheric exposure, the amount of oxygen inflowed during deposition, the amount of oxygen in annealing, and the temperature. Annealing of the barrier layer is performed at a temperature of 450° C. to 550° C. under a $N_2$ atmosphere for 30–60 minutes, which is known as an optimum condition.

However, the oxygen stuffing effect introduced when a diffusion barrier film is annealed causes oxidation of the surface of the diffusion barrier film, and thus causes problems such as contact characteristics when a contact hole is buried by using aluminum in the subsequent process. Thus, the oxygen stuffing effect degrades reliability of a semiconductor device. To suppress this degradation, a method for inserting a wetting layer for improving wettability of the metal layer and a method for burying a contact hole after forming a silylation layer and hydrogen-treating are proposed.

In another method, Si or $O_2$ is ion-injected after a TiN layer, i.e., barrier layer, is heat-treated in order to enhance wettability between the barrier metal and aluminum wiring and to enhance a wiring quality and yield (Japanese Laid-open Publication No. 88-176035 by Higatta Masafumi).

In yet another disclosure, in the case where Ti is deposited in advance to an aluminum sputtering and a high temperature aluminum is subsequently deposited so as to fill a via hole whose size is 0.5 $\mu$m and aspect ratio is 1.6, a filling-up effect decreases if Ti is thin (see: VMIC 170–176, 1991). However, as the size of a contact hole becomes smaller, i.e., below 0.5 $\mu$m, the contact hole is not completely filled or a void is generated in the contact hole, to thereby degrade reliability.

FIGS. 1–3 are section views showing a conventional aperture (contact hole) buried wiring structure, wherein various problems which may arise in filling a contact hole are exemplified. First, an impurity diffusion region 4, which will become a source/drain region, is formed on a semiconductor substrate 2. Then, an insulating layer 8 having a contact hole 6 for partially exposing the surface of impurity diffusion region 4 is formed on the resultant structure. (Here, for the convenience of explanation, a gate electrode in MOS structure is not shown.) A titanium layer as an ohmic contact layer (not shown) and a TiN layer 10 as a diffusion barrier layer are sequentially formed on the inner sidewall surface of contact hole 6, on impurity diffusion region 4 exposed by contact hole 6 and on insulating layer 8. In addition, an aluminum layer 12 for filling contact hole 6 is formed on TiN layer 10.

Meanwhile, the above-described contact hole buried wiring structure can be manufactured as follows.

First, a field oxide film (not shown) is formed on semiconductor substrate 2 by a common local oxidation of silicon (LOCOS) method, and an impurity is deposited on semiconductor substrate 2 between the field oxide films, to thereby form impurity diffusion region 4 for forming a source/drain region. Then, an insulating material, for example, silicon oxide ($SiO_2$), is deposited on the resultant structure by a common chemical vapor deposition (CVD) method, thereby forming insulating layer 8. Then, a photoresist pattern (not shown) for forming contact hole 6 is formed on insulating layer 8 which is then etched until impurity diffusion region 4 is exposed, using the photoresist pattern as an etching mask, to thereby form aperture 6. Then, titanium is deposited to a thickness of 300 Å to 900 Å by a sputtering method on the inner sidewall surface of aperture 6, on impurity diffusion region 4 exposed by aperture 6 and on insulating layer 8, to thereby form the ohmic contact layer. Sequentially, the diffusion barrier layer (layer 10) is formed on the Ti layer to a thickness of 600 Å to 2000 Å by a sputtering method. Aluminum is deposited on the resultant structure by a sputtering method, to thereby form aluminum layer 12 for burying aperture 6.

In the above-described conventional contact hole buried wiring structure and a method for manufacturing the same, a Ti layer (i.e., ohmic contact layer), a TiN layer 10 (i.e., diffusion barrier layer), and an Al layer 12 are formed by mainly a sputtering method. However, deposition by a conventional sputtering method causes a void 14 as shown in FIGS. 1 and 2, as the aspect ratio of the contact hole increases, to thereby degrade the reliability of a manufactured device. Also, according to the conventional technique, the step coverage of an aluminum layer is poor, as shown in FIG. 3, so that wiring shorts tend to occur. Thus, a reliability of the device is degraded.

FIG. 4 illustrates an initial nucleation of an aluminum film when aluminum is deposited on the diffusion barrier film shown in FIGS. 1–3, and includes an enlarged view of the sidewall portion showing the initial nucleation. Here, a reference numeral 10 denotes a TiN layer, 10a denotes a TiN grain, 12 denotes an aluminum layer, and 12a denotes an aluminum grain. A characteristic of the TiN layer formed in the inner sidewalls of an aperture and a surface morphology of an aluminum layer will be explained with reference to FIG. 4.

Since the surface of the TiN layer formed on the inner sidewall surface of an aperture is structurally perpendicular to the target when deposition is performed, a relatively small amount of sputtered atoms are deposited. Such tendency occurs obviously when a collimation technique is employed. In addition, since TiN is apt to grow in the <111> direction, columnar grains 10a are formed.

Meanwhile, in general, a TiN layer obtained by a sputtering method or CVD method is not amorphous. Therefore, the inner sidewalls of the contact hole where relatively few sputtered atoms are formed has a rough surface. Accordingly, an initial deposition characteristic of an aluminum atom formed on the rough diffusion barrier film is poor. In other words, a nucleation of aluminum around the relatively large TiN grains does not occur uniformly, and the aluminum is deposited unevenly and discontinuously as shown in the enlarged view. Therefore, even though heat treatment is performed by depositing aluminum in a contact hole during a subsequent process, a void is generated, and generation of such a void becomes easier in a contact hole having a high aspect ratio. Thus, reliability of a semiconductor device is degraded.

SUMMARY OF THE INVENTION

Accordingly, it is an object of the present invention to provide a wiring structure of a semiconductor device for forming a smooth surface of a diffusion barrier film so as to effectively bury a contact hole having a high step.

It is another object of the present invention to provide a method for suitably forming a wiring structure of a semiconductor device provided with a diffusion barrier film having a smooth surface.

To accomplish the above object of the present invention, there is provided a wiring structure of a semiconductor device comprising: a semiconductor substrate; an insulating layer formed on the semiconductor substrate and including an aperture formed therein; a diffusion barrier film which has a smooth surface formed through a plasma irradiation on both sidewalls of the aperture; and a metal layer formed on the diffusion barrier film.

The diffusion barrier film consists of a refractory metal or a refractory metal compound. Specifically, the refractory metal may be Ti and the refractory metal compound may be TiN. In addition, the aperture is a contact hole for exposing an impurity diffusion region of the semiconductor substrate or a via hole for exposing a lower conductive layer. The metal layer may be formed of aluminum or aluminum alloy.

There is also provided a wiring structure of a semiconductor device comprising: a semiconductor substrate; an insulating layer formed on the semiconductor substrate and including an aperture formed therein; a diffusion barrier film which has a smooth surface formed through a plasma irradiation on both sidewalls of the aperture; and a metal layer buried in the aperture where the diffusion barrier film is formed.

There is provided a method for forming a wiring structure of a semiconductor device comprising the steps of: forming an insulating layer on a semiconductor substrate; forming an aperture on the insulating layer; forming a diffusion barrier film on the insulating layer, on the substrate exposed by the aperture and on the inner sidewalls of the aperture; plasma irradiating the surface of the diffusion barrier film formed on the inner sidewalls of the aperture; and forming a metal layer on the plasma-irradiated diffusion barrier film.

In the present invention, plasma is employed for smoothing the surface of the diffusion barrier film. The plasma is formed by an electron cyclotron resonance (ECR) plasma using an inert gas, an RF plasma device or a magnetron-enhanced plasma device. Specifically, a plasma processing effect can be enhanced by adding hydrogen to the inert gas.

In addition, the metal layer can be formed by a chemical vapor deposition (CVD) method, and a heat treatment can be further performed after the step of forming the diffusion barrier film. In addition, a step of performing a heat treatment to bury the aperture can be further comprised after the step of forming the metal layer.

In addition, the method of the present invention may further comprise the step of forming a second metal layer after the step of burying the aperture. The metal layer can be formed through two deposition processes, firstly deposited at a first temperature, and secondly at a second temperature. The first temperature should to be lower than the second temperature.

There is provided another embodiment of the present invention comprising the steps of: forming an insulating layer on a semiconductor substrate; forming an aperture on the insulating layer; forming a first diffusion barrier film on the insulating layer, on the substrate exposed by the aperture, and on the inner sidewalls of the aperture; plasma irradiating a surface of the first diffusion barrier film formed on the sidewalls of the aperture; forming a second diffusion barrier film on the plasma-irradiated first diffusion barrier film; forming a metal layer all over the substrate where the second diffusion barrier film is formed; and burying the aperture by performing a heat treatment on the metal layer.

The metal layer can be subsequently formed without breaking a vacuum after the second diffusion barrier film is formed. In addition, a step of forming a second metal layer can be further comprised after the step of forming the metal layer.

Further, a heat treatment can be performed after the step of forming the second diffusion barrier film. And, a heat treatment can be performed after the step of plasma irradiating a surface of the first diffusion barrier film.

There is provided a method for forming a wire of a semiconductor device comprising the steps of: forming an insulating layer on a semiconductor substrate; forming an aperture on the insulating layer; forming a first diffusion barrier film on the insulating layer, on the substrate exposed by the aperture, and on the inner sidewalls of the aperture; plasma irradiating a surface of the first diffusion barrier film formed on the sidewalls of the aperture; forming a second diffusion barrier film on the plasma-irradiated first diffusion barrier film; and performing a high temperature sputtering all over the substrate where the second diffusion barrier film is formed so as to bury the aperture.

Since an initial deposition characteristic of an aluminum atom is excellent, the metal layer, i.e., an aluminum film, is formed on the smooth diffusion barrier film such that an aluminum film is uniformly and continuously deposited to have an excellent step coverage. Accordingly, a contact hole having a high step coverage can be effectively buried, to thereby enhance a reliability of a device.

BRIEF DESCRIPTION OF THE DRAWINGS

The above objects and other advantages of the present invention will become more apparent by describing in detail preferred embodiments thereof with reference to the attached drawings in which:

FIGS. 6A–6D show embodiment 1 of a method for forming a wire layer of a semiconductor device of the present invention, wherein FIGS. 6B and 6C include an enlarged view showing the surface of the diffusion barrier film formed on the sidewall of the aperture;

FIGS. 9A–9C are section views of embodiment 5 of a method for forming a wire layer of a semiconductor device of the present invention, wherein FIG. 9A includes an enlarged view showing the surface of the diffusion barrier film formed on the sidewall of the aperture;

DETAILED DESCRIPTION OF THE INVENTION

The structure of a metal wiring layer of a semiconductor device according to the present invention will be explained with reference to FIG. 5. (To simplify explanation of the present invention, a gate region is not shown and explanation thereof has been omitted.)

Figure 1:
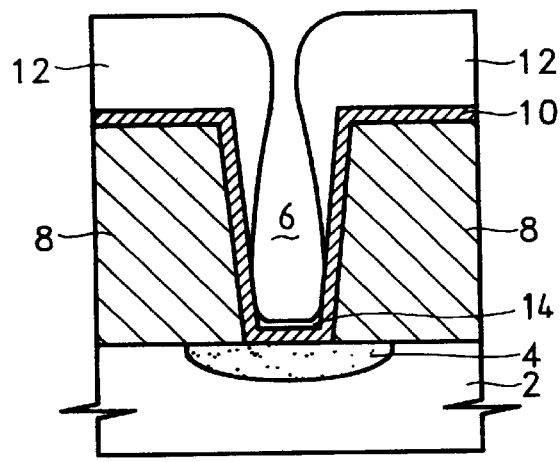
FIGS. 1, 2 and 3 are section views showing the various problems of a conventional buried wiring structure.
Figure 2:
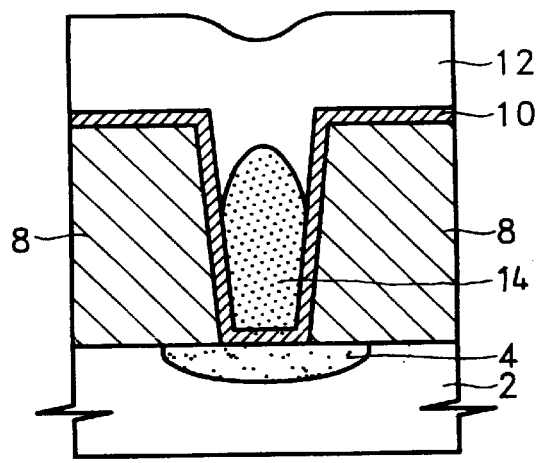
Figure 3:
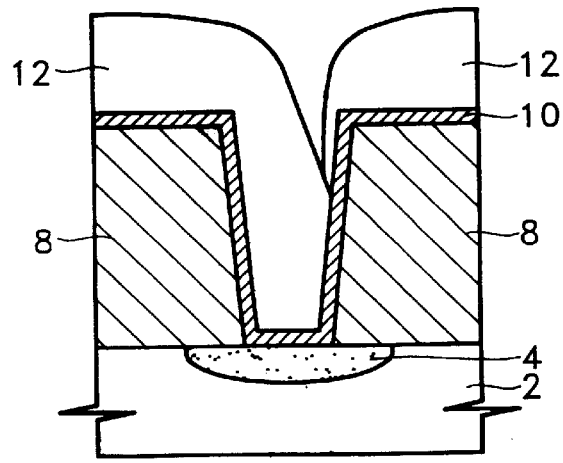
Figure 4A:
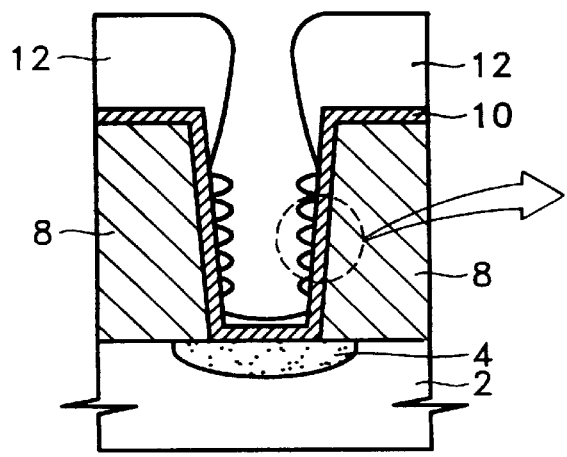
FIG. 4 illustrates an initial nucleation of an aluminum film when aluminum is deposited on the diffusion barrier film shown in FIGS. 1–3.
Figure 4B:
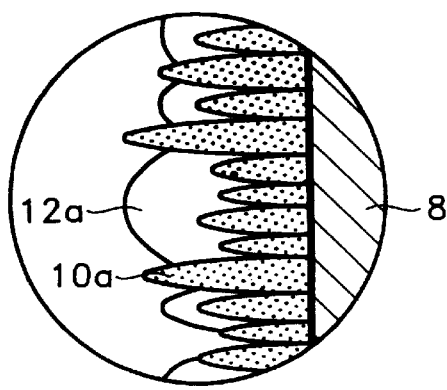
Figure 5A:
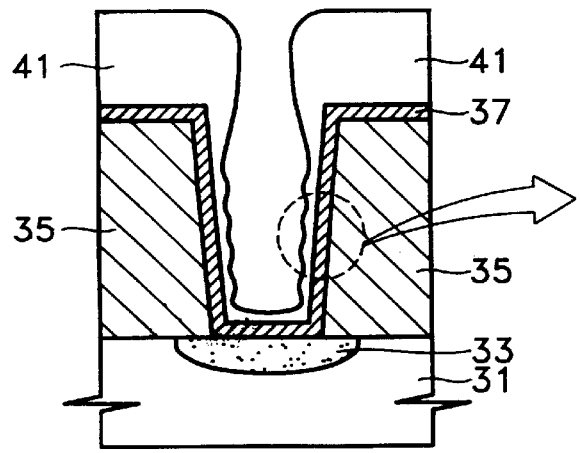
FIG. 5 illustrates a wire layer structure of the semiconductor device of the present invention and the initial nucleation of a metal layer on the sidewall of an aperture.
Figure 5B:
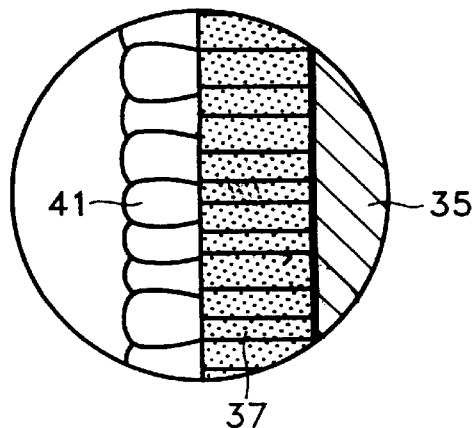

Referring to FIG. 5, an impurity diffusion region 33 which will become a source/drain region is formed on a semiconductor substrate 31. The impurity can be either $N^+$ or $P^+$ type and a field oxide film (not shown) can be formed to the right and left of the impurity diffusion region. Here, impurity diffusion region 33 formed in semiconductor substrate 31 is merely an embodiment of a silicon layer suitable for accomplishing the object of the present invention, which is to provide a contact hole buried structure for burying an upper conductive layer in a silicon layer in a lower portion of an aperture, e.g., contact hole or via hole. For example, impurity diffusion region 33 formed in the semiconductor substrate can be replaced by a lower conductive layer (not shown), for example, a polysilicon layer formed on an arbitrary lower structure atop the semiconductor substrate. The embodiment of a contact hole buried structure (described later) can be applied to the via hole buried structure formed on the lower conductive layer.

An insulating layer 35 having an aperture (contact hole) for exposing the impurity diffusion region is formed on the resultant structure. Insulating layer 35 consists of insulating materials, for example, silicon oxide. The aperture may be a contact hole for exposing impurity diffusion region 33 or a via hole for exposing a lower conductive layer, for example, polysilicon.

Then, a diffusion barrier film 37 is formed. The diffusion barrier film 37 can be a TiN layer formed on a Ti layer (not shown). The Ti layer is formed on the inside surface of the aperture, on impurity diffusion region 33 exposed by the aperture and on insulating layer 35. The diffusion barrier film 37 can also be a Ti layer.

Then, aluminum is deposited on the resultant structure by a sputtering method, to thereby form a metal layer 41 for burying the aperture.

In FIG. 5, an initial nucleation of the metal layer is shown in a detailed view of the diffusion barrier film and metal layer formed on the sidewall of the aperture. Here, a smooth diffusion barrier film 37 without having grain boundaries is formed on the sidewall of the aperture. An initial deposition characteristic of the aluminum atoms on the sidewall of diffusion barrier film 37 is excellent. In other words, a nucleation of an aluminum film occurs uniformly due to the uniform TiN grain or smooth surface of TiN film. Accordingly, the aluminum film is deposited uniformly and continuously, different from a conventional technique.

Embodiment 1

Figure 6A:
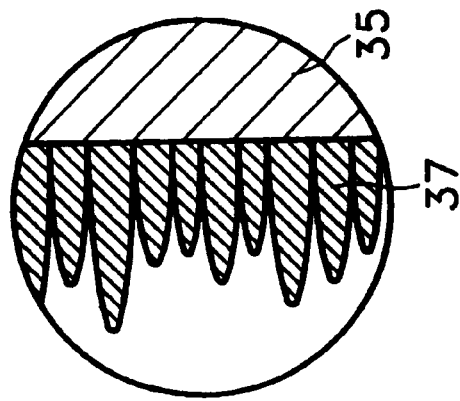
Figure 6A:
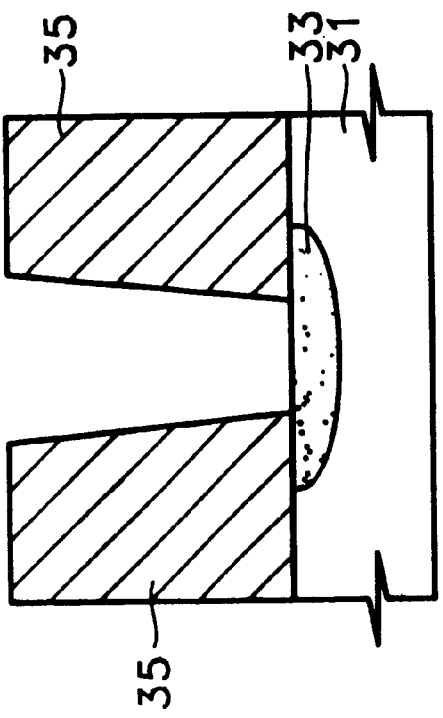
Figure 6A:
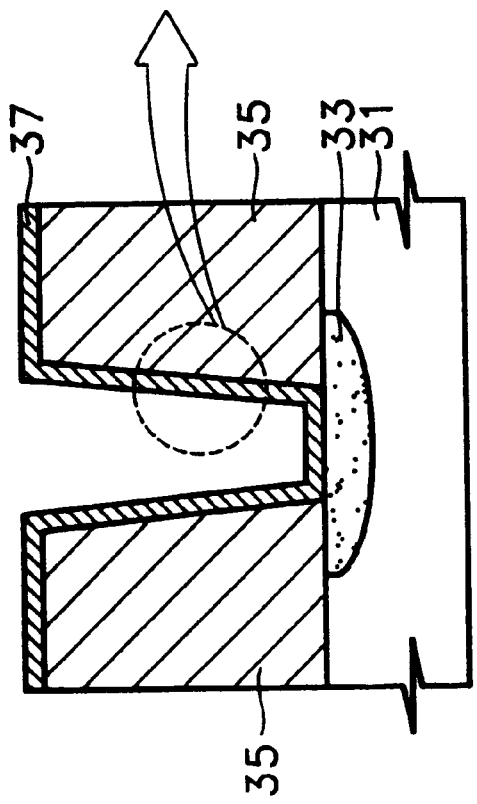

FIGS. 6A–6D are section views showing embodiment 1 of a method for forming a wire layer of a semiconductor device of the present invention, with FIGS. 6B and 6C including enlarged views showing a surface of the diffusion barrier film formed on the inner sidewalls of the aperture.

FIG. 6A shows the step of forming insulating layer 35 having an aperture on semiconductor substrate 31.

A field oxide film (not shown) is formed on semiconductor substrate 31 by a general LOCOS method, and an $N^+$ or $P^+$ type impurity is implanted on semiconductor substrate 31 between field oxide films, to thereby form impurity diffusion region 33 for forming a source/drain region. Here, the process of forming the field oxide film is arbitrary, and the impurity diffusion region can be replaced by an arbitrary silicon layer, for example, polysilicon, according to the object of the present invention.

An insulating material, for example, silicon oxide ($SiO_2$), is deposited on the resultant structure by a general CVD method, to thereby form an insulating material layer. The insulating material layer is formed to a thickness of 0.8 $\mu$m to 1.6 $\mu$m by employing a borophosphorous silicate glass (BPSG). Subsequently, a photoresist pattern (not shown) for forming an aperture is formed on the insulating material layer. Then, using the photoresist pattern as an etching mask, the insulating material layer is etched until impurity diffusion region 33 is exposed, to thereby form insulating layer 35 having an aperture.

FIG. 6B shows the step of forming diffusion barrier film 37 all over the substrate where the aperture is formed.

Diffusion barrier film 37 is formed all over insulating layer 35, inside an aperture 36 and on the exposed surface of semiconductor substrate 31. In more detail, Ti is deposited to a thickness of 200 Å to 300 Å by a sputtering method in an argon atmosphere at 2 mTorr to form a Ti layer, and titanium nitride is deposited to a thickness of 300 Å to 500 Å by a sputtering method under the condition where an amount of argon gas is 30–50 sccm and an amount of nitrogen is 50–85 sccm so as to form diffusion barrier film 37. The deposition speed is approximately 500 Å per minute when the Ti layer is deposited. In addition, the substrate temperature is 200° when Ti or TiN is deposited.

Specifically, when the Ti layer or TiN is deposited, a collimation technique can be employed. The size of the collimator is ⅝" and the aspect ratio is 1.5:1. In addition, the TiN layer formed on the sidewalls of the aperture has a rough surface in the sidewalls of the contact hole where a relatively small number of the sputtered atoms are formed, as shown in the enlarged view of FIG. 6B.

FIG. 6C shows the step of plasma irradiating the surface of TiN layer 37.

Surface of TiN layer 37 is eroded by employing an argon plasma, and the plasma irradiating is performed using an ECR(electron cyclotron resonance) plasma, RF plasma or a magnetron-enhanced plasma device.

In more detail, during the plasma irradiation employing the argon plasma, the surface of the TiN layer is eroded through a collision between the TiN layer formed on the sidewalls and argon ions ($Ar^+$) or through absorption of the momentum of argon ions in TiN layer. As a result, a TiN layer 39b having a smooth surface without having grain boundaries and a TiN layer 39a having a rough surface are formed.

First, plasma irradiation employing ECR plasma will be explained.

Surface of TiN layer 37 is plasma-irradiated at the state where an RF bias of approximately 50V is applied by employing ECR plasma. In more detail, the ECR plasma device performs the process under a condition where microwave power is 1 kW (magnetron frequency: 2.45 GHz), an argon pressure is 5 mTorr and a substrate temperature is room ambient. The TiN layer is etched approximately by 30 Å when a standard oxide film ($SiO_2$) is etched by 100 Å. Specifically when the ECR plasma device is employed, advantageously a small bias may be applied to a substrate and a surface treatment effect can be increased by adding hydrogen.

Now, plasma-irradiation by employing an RF or magnetron-enhanced plasma device will be explained.

The sputtering device performs a plasma irradiating under a condition where frequency is 13.56 MHz, bias voltage is 960V, an argon atmosphere is 7 mTorr and substrate temperature is 200° C. Here, the sputter etching by plasma irradiating is performed by having 100 Å of oxide film ($SiO_2$) as a standard. The effect is the same when an etching is performed for an standard oxide film exceeding 100 Å. The rough surface of the TiN grains on the sidewalls of the aperture is eroded, thereby forming a TiN layer with a smooth surface, as shown in the enlarged view of FIG. 6C.

FIG. 6D shows the step of forming metal layer 41 for burying an aperture.

In more detail, aluminum is deposited on the inner sidewalls of the aperture and impurity diffusion region 33 exposed by the aperture by a sputtering method, to thereby form metal layer 41 for burying the aperture. Here, deposition of metal layer 41 is performed under a condition where a deposition temperature is 200° C., an argon pressure is 4 mTorr and a deposition speed is 50 to 150 Å per second. It is more desirable to control the deposition speed to 125 Å per second. As described above, since the nucleation of an aluminum layer formed on a smooth TiN layer occurs uniformly, a deposition characteristic and step coverage are enhanced.

In the meantime, to obtain better step coverage, an aluminum is firstly deposited under a condition where the temperature is below 100° C. and deposition speed is 50 Å to 150 Å per second. Then, the aluminum is deposited at a temperature higher than 200° C. and at a higher deposition speed of 100 Å to 150 Å per second. Here, an excellent step coverage at a low temperature and an atom mobility improvement at a high temperature can be simultaneously obtained.

Embodiment 2

Figure 7A:
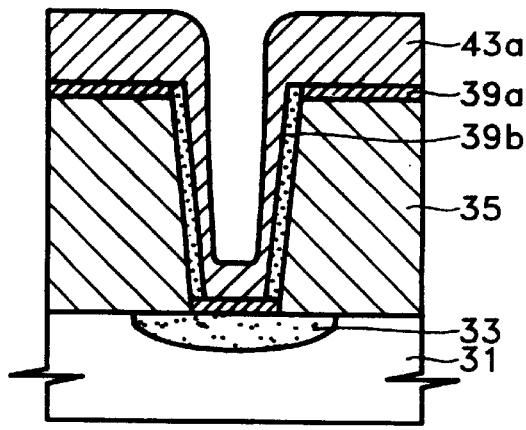
FIGS. 7A–7C are section views of embodiment 2 of a method for forming a wire layer of a semiconductor device of the present invention.
Figure 7B:
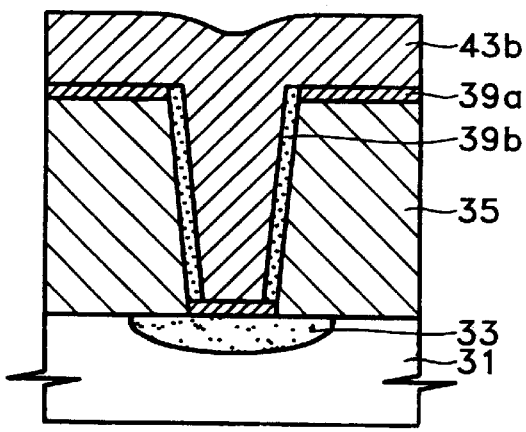
Figure 7C:
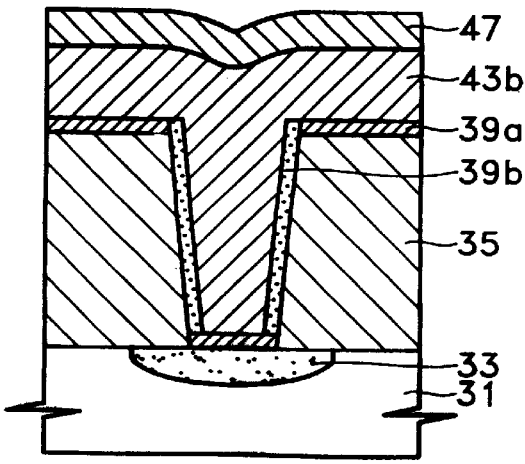

FIGS. 7A–7C are section views of embodiment 2 of a method for forming a wire layer of a semiconductor device of the present invention. Embodiment 2 is the same as embodiment 1 except for a step of forming a metal layer at a low temperature and a step of performing a vacuum heat treatment. Here, like elements are denoted by the same reference numerals as those of embodiment 1. Also, the first steps performed in embodiment 2 are the same as those corresponding to FIGS. 6A–6C in embodiment 1.

FIG. 7A shows the step of forming a first metal layer 43a. In more detail, a first metal layer 43a consisting of aluminum or an aluminum alloy (for example, Al—Si—Cu) is formed on the inner sidewalls of an aperture, on a substrate exposed by the aperture and on a diffusion barrier film. First metal layer 43a is formed by employing a DC magnetron device under a condition where the temperature is lower than 200° C. (desirably, low temperature of 25° C.), the degree of vacuum is below 5.0E–7 Torr (more desirably, below 5.0E–8 Torr) and deposition speed is 100 Å per second. When first metal layer 43a is formed, low pressure sputtering or collimation can be employed under a condition where working pressure is below 2 mTorr in order to reduce an overhang phenomenon at the top of the aperture.

FIG. 7B shows the step of performing a heat treatment on first metal layer 43a. Here, first metal layer 43a formed on the aperture is vacuum-heat-treated by means of raising the temperature of the DC magnetron device or transferring the substrate to a chamber having a high temperature. In more detail, the vacuum heat treatment is performed in such a way that first metal layer 43a is heat-treated for two minutes without a vacuum break under a condition where the temperature is 50% to 90% of a melting point of the aluminum alloy, for example, above 450° C., and in an argon or reduction atmosphere below 10 mTorr, to thereby move the atoms of the aluminum alloy which is sputtered at a low temperature. As a result, the aperture is buried as shown in FIG. 7B so as to form the buried first metal layer 43b. Here, the temperature of the heat treatment can be lowered as the degree of vacuum is enhanced when deposition or vacuum heat treatment is performed.

FIG. 7C shows the step of forming second metal layer 47 on the buried first metal layer 43b. In more detail, a second metal layer 47 is formed by using the same material as that of first metal layer 43a on the buried first metal layer 43b. However, the step of forming second metal layer 47 may be unnecessary in the case where the overhang phenomenon occurs less because first metal layer 43a is formed to a desired thickness and heat-treated so as to bury the aperture.

Embodiment 3

Figure 8A:
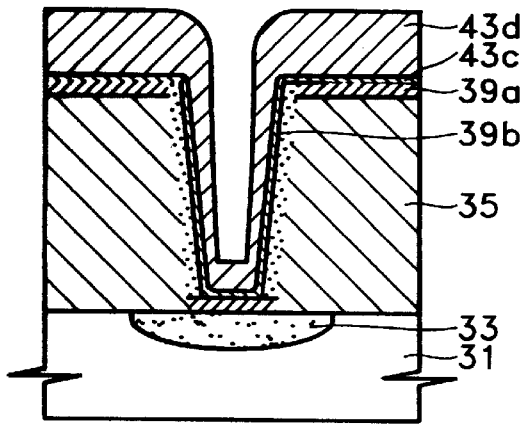
FIGS. 8A–8C are section views of embodiment 3 of a method for forming a wire layer of a semiconductor device of the present invention.
Figure 8B:
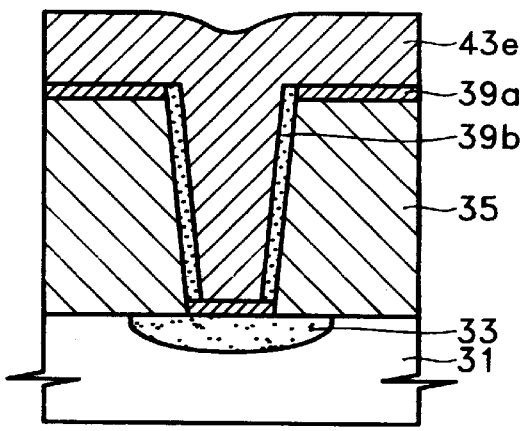
Figure 8C:
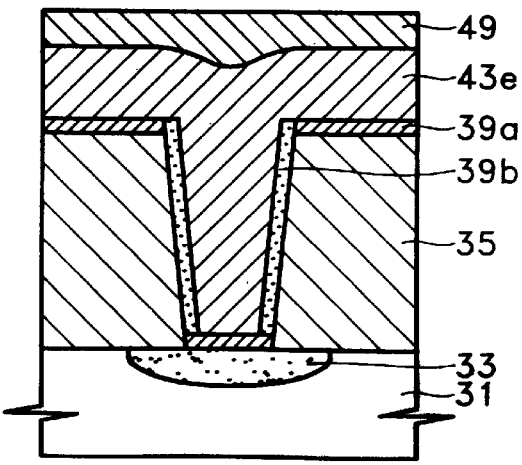

FIGS. 8A–8C are section views of embodiment 3 of a method for forming a wire layer of a semiconductor device of the present invention. Embodiment 3 is the same as embodiment 2 except that first metal layers 43c and 43d are formed by firstly depositing a metal material at a temperature below 200° C. and secondly at a temperature above 400° C. Here, like elements are denoted by the same reference numerals as those of embodiment 2. Also, the first steps performed in embodiment 3 are the same as those corresponding to FIGS. 6A–6C in embodiment 1.

FIG. 8A shows the step of forming first metal layers 43c and 43d. Here, first metal layers 43c and 43d consisting of Al—Si—Cu are formed on the sidewalls of an aperture, on the substrate exposed by the aperture and on a diffusion barrier film. In more detail, first metal layers 43c and 43d are formed through the following process. Aluminum or an aluminum alloy (for example, Al—Si—Cu) is firstly deposited to a thickness of less than half of the desired thickness at a temperature of 200° C. or below, and an aluminum alloy of Al—Si—Cu is secondly deposited at a desirable temperature of 450° C. Here, the deposition speed has to be lower than 100 Å per second at a low temperature, i.e., 200° C. or below, and 150 Å per second at a high temperature, i.e., 400° C. or above.

FIG. 8B shows the step of performing a heat treatment on first metal layers 43c and 43d. In more detail, first metal layers 43c and 43d formed on the aperture is vacuum-heat-treated by means of raising the temperature of a DC magnetron device or transferring the substrate to a chamber having a high temperature. Surface atoms of aluminum move due to such vacuum heat treatment, and thus the aperture is buried as shown in FIG. 8B so as to form the buried first metal layer 43e. Here, the temperature of the heat treatment can be lowered as the degree of vacuum is enhanced when deposition or vacuum heat treatment is performed.

FIG. 8C shows the step of forming a second metal layer 49 on the buried first metal layer 43b. In more detail, second metal layer 49 is formed by using the same material as that of first metal layers 43c and 43d on the buried first metal layer 43e. The step of forming second metal layer 49 may be unnecessary because first metal layer 43b can be formed to a desired thickness and heat-treated so as to bury the aperture.

Embodiment 4

Embodiment 4 is the same as embodiment 3 except that a second vacuum heat treatment is performed after the second metal layer is formed in embodiment 3. In more detail, the process steps of embodiment 3 are performed in sequence, and a second vacuum heat treatment is performed subsequently. The second vacuum heat treatment is performed at a temperature of the first vacuum heat treatment, for example, 450° C. Or, the second vacuum heat treatment is performed at a low temperature of the first vacuum heat treatment.

Embodiment 5

FIGS. 9A–9C are section views showing embodiment 5 of a method for forming a wire layer of a semiconductor device of the present invention, wherein FIG. 9A includes an enlarged view showing a surface of a diffusion barrier film formed on the sidewall of the aperture. Embodiment 5 is the same as embodiments 3 and 4 except that a second diffusion barrier film is formed prior to forming a first metal layer. Here, like elements are denoted by the same reference numerals as those of embodiment 4. Also, the first steps performed in embodiment 5 are the same as those corresponding to FIGS. 6A–6C in embodiment 1.

FIG. 9A shows the step of forming a second diffusion barrier film 42 and a first metal layer 43f.

After the step corresponding to FIG. 6C is performed, the first diffusion barrier film is heat-treated in a nitrogen atmosphere of 450° C., to thereby enhance the thermal endurance of the diffusion barrier film. Such an enhancement in thermal endurance results from an oxygen stuffing effect and silicidation in the Ti layer formed under the TiN layer. In other words, when Ti under the TiN layer reacts with the aluminum formed later, $Al_3Ti$ is formed. Thus, junction spiking occurs at a temperature of 450° C. due to silicon and $Al_3Ti$ having a high solubility. Accordingly, a reaction between Ti and Si produces $TiSi_2$/TiN structure, to thereby enhance thermal endurance of the diffusion barrier film. In addition, a first diffusion barrier film, i.e., TiN, keeps a smooth surface on the sidewalls of the aperture after heat-treatment is performed.

Then, second diffusion barrier film 42 is formed by depositing Ti or TiN to a thickness of 100 Å to 200 Å on the sidewalls of the aperture, on the substrate exposed by the aperture and on the first diffusion barrier film, in order to enhance a wettability of aluminum film. Specifically, TiN grain, i.e., second diffusion barrier film 42, is formed into extremely small and regular size on the smooth surface of the sidewall of the aperture.

First metal layer 43f consisting of aluminum or an aluminum alloy, i.e., Al—Si—Cu, is formed. Since the TiN grain is formed of extremely small and regular size on the smooth surface of the sidewalls of the aperture, an initial nucleation of the first metal layer occurs uniformly, and an excellent step coverage can be formed. First metal layer 43f can be formed through two steps as in embodiments 3 and 4.

FIG. 9B shows the step of performing heat treatment on first metal layer 43f.

In more detail, first metal layer 43f formed on the aperture is vacuum-heat-treated. Surface atoms of an aluminum film move to the aperture and are buried due to the vacuum heat treatment as shown in FIG. 9B, to thereby form a buried first metal layer 43g. Since the buried first metal layer 43g exhibits uniform nucleation in an early stage of an aluminum deposition and has an excellent step coverage, a burying characteristic is enhanced when heat-treatment is performed. As a result, the reliability in a semiconductor device can be enhanced.

Besides the above-described burying method employing a heat treatment following the formation of the first metal layer, the buried first metal layer can be formed by a high temperature sputtering at a temperature exceeding 400° C.

FIG. 9C shows the step of forming a second metal layer 51 on the buried first metal layer 43g.

In more detail, second metal layer 51 is formed on the buried first metal layer 43g by using the same material as that of first metal layer 43g. However, in the case where the overhang phenomenon occurs less, the step of forming second metal layer 51 may be unnecessary because first metal layer 43g may be formed to a desired thickness and heat-treated so as to bury the aperture.

Embodiment 6

Figure 10A:
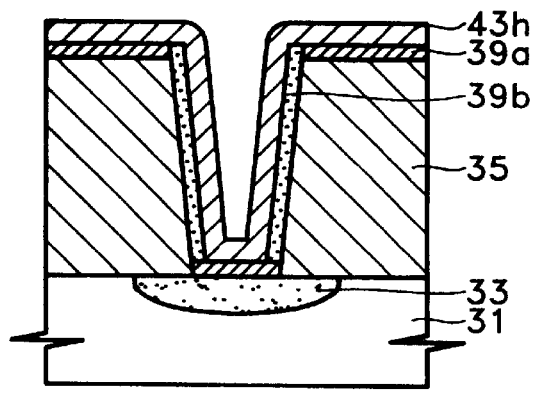
FIGS. 10A–10C are section views of embodiment 6 of a method for forming a wire layer of a semiconductor device of the present invention.
Figure 10B:
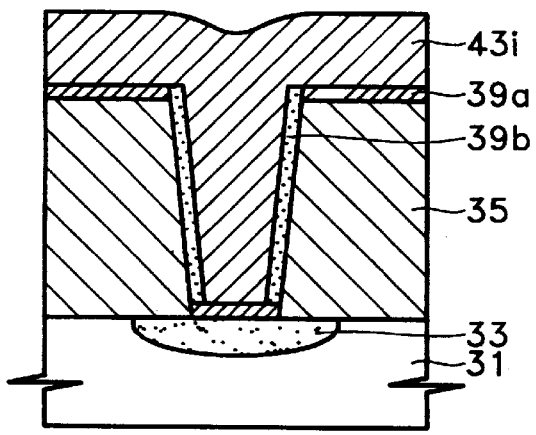
Figure 10C:
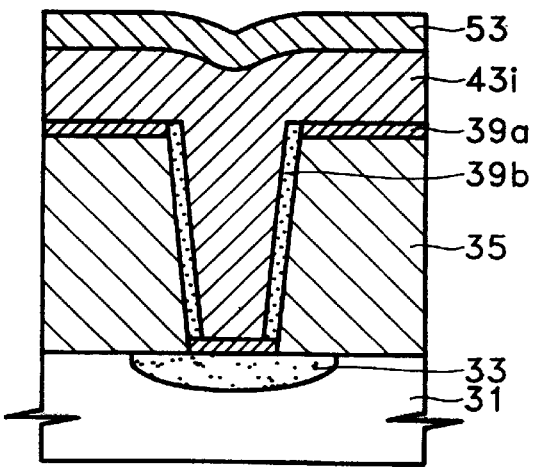

FIGS. 10A–10C are section views showing embodiment 6 of a method for forming a wire layer of a semiconductor device of the present invention. Embodiment 6 is the same as embodiments 2 to 5 except that, after a first metal layer is formed by CVD method, the first metal layer is vacuum heat-treated, or an aluminum alloy is sputtered on the first metal layer and vacuum heat-treated, so as to bury an aperture. Here, like elements are denoted by the same reference numerals as those of embodiment 2. Also, the first steps performed in embodiment 6 are the same as those corresponding to FIGS. 6A–6C in embodiment 1.

FIG. 10A shows the step of forming a first metal layer 43h. First metal layer 43h consisting of aluminum is formed by a CVD method on the sidewalls of an aperture, on a substrate exposed by the aperture and on a diffusion barrier film. In more detail, the deposition of aluminum or an aluminum alloy can be performed by a common CVD method. For example, the deposition can be performed by using an organic metal compound, e.g., triisobutyl aluminum (TIBA) or dimethyl aluminum hydride ((CH$_3$)$_2$AlH: DMAH), as a source. When deposition is performed by using TIBA, a cold-wall-type apparatus is employed to maintain a vapor temperature below 90° C., and desirably at 84–86° C., when the TIBA is introduced. In addition, inert gas, for example, argon, is bubbled and used as a carrier gas. Here, the desirable flow speed of the argon gas is approximately 7l per minute. The deposition temperature at a thermal decomposition of the TIBA is approximately 250° C., which is not desirable because the deposition speed is high. Since the deposition speed decreases as the temperature is lowered, the deposition can be performed at a lower temperature in order to reduce the deposition speed. Under such conditions, the deposition speed is approximately 1,000 Å per minute, and the aluminum is deposited approximately for one minute by employing TIBA for a contact hole size of 0.2 $\mu$m.

As an alternative method, first metal layer 43h is deposited by using an aluminum hydrogen, for example, DMAH, etc. At this time, the aluminum hydrogen is preserved at a low temperature and the deposition is performed at a temperature exceeding 50° C. in order to prevent a thermal decomposition of the aluminum hydrogen. The temperature of the source can be controlled by employing an inert gas, i.e., argon. In addition, the temperature of the substrate is lowered or an amount of the source is decreased so as to reduce a deposition speed. In the deposition method employing an aluminum hydrogen, deposition temperature can be lowered by using a suitable source. The deposition is performed in a reactive chamber where the pressure is 0.01–1.0 Torr and temperature is 50–150° C. Since first metal layer 43h is formed by the CVD method on the smooth surface of the TiN formed on the sidewalls of the aperture, an excellent step coverage is achieved, as shown in FIG. 10A.

FIG. 10B shows the step of burying an aperture by performing a heat treatment on first metal layer 43h. In more detail, first metal layer 43h formed on the aperture is vacuum-heat-treated without breaking the vacuum, or an aluminum alloy, for example, Al—Si—Cu, is sputtered on the first metal layer 43h and vacuum heat-treated. Surface atoms of the aluminum film move due to the vacuum heat treatment so as to bury the aperture as shown in FIG. 10B, thereby forming the buried first metal layer 43i. Here, the temperature of the heat treatment can be lowered as the degree of vacuum increases when a deposition or vacuum heat treatment is performed.

Meanwhile, if the second metal layer is formed to a thickness of half the aperture size when the second metal layer is formed by the CVD method, the aperture can be buried without having a seam or void. Thus, the aperture can be buried without performing the vacuum heat treatment. If the seam or void is generated, it can be removed by subsequent vacuum heat treatment. Accordingly, the vacuum heat treatment is optional.

FIG. 10C shows the step of forming second metal layer 53 on the buried first metal layer 43i. In more detail, second metal layer 53 is formed by using the same material as that of first metal layer 43i on the buried first metal layer 43i by a sputtering method. Alternatively, the same material as that of first metal layer 43i is sputtered on the buried first metal layer 43i so as to form second metal layer 53 which will be vacuum-heat-treated. The step of forming second metal layer 53 may be unnecessary because first metal layer 43h can be formed to a desired thickness and heat-treated so as to bury the aperture.

Comparative Example

Figure 11:
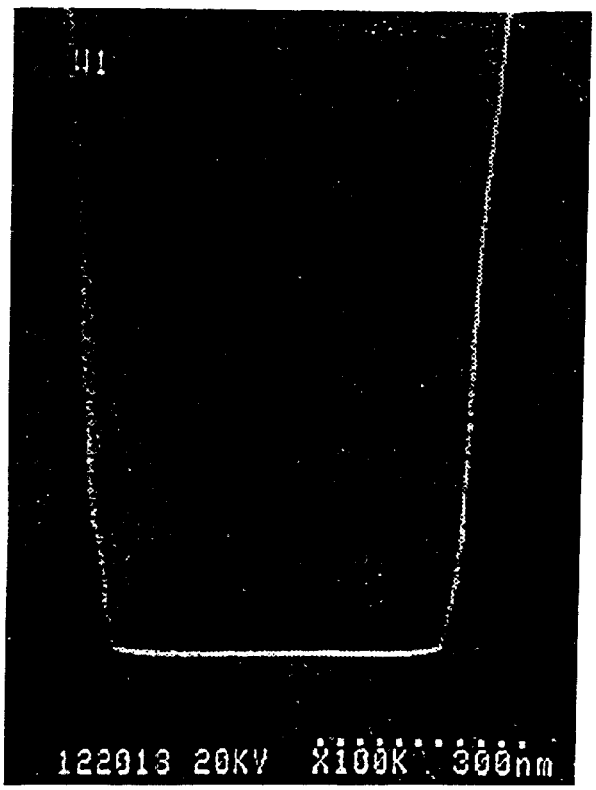
FIGS. 11 and 12 are SEM photos of a TiN surface which is plasma-irradiated according to the present invention and a conventional TiN surface which is not plasma-irradiated, respectively.
Figure 12:
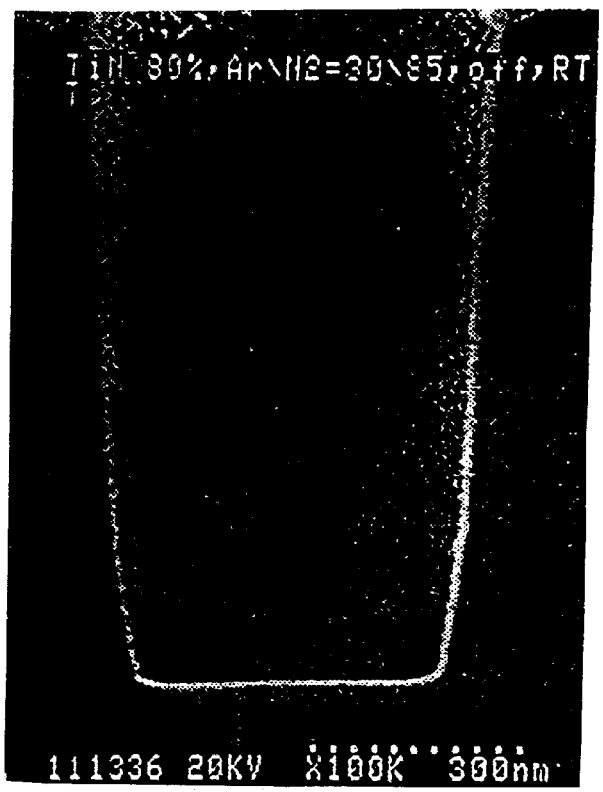

FIGS. 11 and 12 are SEM photos of a TiN surface which is plasma-irradiated according to the present invention and a conventional TiN surface which is not plasma-irradiated, respectively. In FIG. 11, the surface of the TiN is smooth and has no grain boundaries. In FIG. 12, the surface of the TiN of a conventional technique is rough.

According to the present invention, since an initial deposition characteristic of aluminum atoms is excellent, an aluminum film of the metal layer is formed uniformly and continuously. Thus, an aluminum film of the metal layer formed on the sidewall of the smooth diffusion barrier film has a good step coverage. Therefore, a contact hole having a high aspect ratio can be effectively buried without producing a void therein, to thereby enhance the reliability of a manufactured device.

It is understood by those skilled in the art that the foregoing description refers to preferred embodiments of the disclosed device and that various changes and modifications may be made in the invention without departing from the spirit and scope thereof.

What is claimed is:

1. A wiring structure of a semiconductor device comprising:
   a semiconductor substrate;
   an insulating layer formed on said semiconductor substrate and which includes an aperture formed therein; and
   a diffusion barrier film which has a smooth and eroded surface and no grain boundary at a surface thereof so as to uniformly nucleate a metal layer, said diffusion barrier film being formed through a plasma irradiation on both sidewalls of said aperture;
   wherein said metal layer is formed on said diffusion barrier film.

2. A wiring structure of a semiconductor device according to claim 1, wherein said diffusion barrier film is made up of a refractory metal or refractory metal compound.

3. A wiring structure of a semiconductor device according to claim 2, wherein said refractory metal is Ti and said refractory metal compound is TiN.

4. A wiring structure of a semiconductor device according to claim 1, wherein said aperture is a contact hole for exposing an impurity diffusion region of said semiconductor substrate or a via hole for exposing a lower conductive layer.

5. A wiring structure of a semiconductor device comprising:
   a semiconductor substrate;
   an insulating layer formed on said semiconductor substrate and including an aperture formed therein; and
   a diffusion barrier film which has a smooth and eroded surface and no grain boundary at a surface thereof so as to uniformly nucleate a metal layer, said diffusion barrier film being formed through a plasma irradiation on both sidewalls of said aperture;
   wherein said metal layer is buried in said aperture where said diffusion barrier film is formed.

6. A method for forming a wiring structure of a semiconductor device comprising the steps of:
   (a) forming an insulating layer on a semiconductor substrate;
   (b) forming an aperture on said insulating layer;
   (c) forming a diffusion barrier film on said insulating layer, on the substrate exposed by said aperture and on the inner sidewalls of said aperture;
   (d) etching by irradiating a surface of said diffusion barrier film with plasma, so as to smooth and erode the surface of said diffusion barrier film formed on the inner sidewalls of said aperture so that said smoothed and eroded surface of said diffusion barrier film has no grain boundaries; and
   (e) forming a metal layer on said plasma-irradiated diffusion barrier film and increasing the filling characteristics of said metal layer by providing a plasma treatment to said diffusion barrier film.

7. A method for forming a wiring structure of a semiconductor device according to claim 6, wherein said etching step is performed using one selected from the group consisting of an ECR plasma device using an inert gas, an RF plasma device and a magnetron-enhanced plasma device.

8. A method for forming a wiring structure of a semiconductor device according to claim 7, wherein said etching step includes increasing a smoothing effect by adding hydrogen to said inert gas.

9. A method for forming a wiring structure of a semiconductor device according to claim 6, wherein said metal layer forming step is performed by a CVD method.

10. A method for forming a wiring structure of a semiconductor device according to claim 6 further comprising the step of:
    heat treating said diffusion barrier film before performing said metal layer forming step.

11. A method for forming a wiring structure of a semiconductor device according to claim 6, further comprising the step of heat treating said metal layer so as to bury said aperture after performing said metal layer step.

12. A method for forming a wiring structure of a semiconductor device according to claim 11, further comprising the step of forming a second metal layer after said step of burying said aperture.

13. A method for forming a wiring structure of a semiconductor device according to claim 6, wherein said metal layer forming step includes:
    firstly depositing a metal material at a first temperature, and secondly depositing said metal material at a second temperature different than said first temperature.

14. A method for forming a wiring structure of a semiconductor device according to claim 13, wherein said first temperature is lower than said second temperature.

15. A method for forming a wiring structure of a semiconductor device comprising the steps of:
    (a) forming an insulating layer on a semiconductor substrate;
    (b) forming an aperture on said insulating layer;
    (c) forming a first diffusion barrier film on said insulating layer, on the substrate exposed by said aperture, and on the inner sidewalls of said aperture;
    (d) etching by irradiating a surface of said first diffusion barrier film with plasma, so as to smooth the surface of said first diffusion barrier film formed on the inner sidewalls of said aperture;
    (e) forming a second diffusion barrier film on said etched first diffusion barrier film;
    (f) forming a metal layer all over the substrate where said second diffusion barrier film is formed; and
    (g) burying said aperture by performing a heat treatment on said metal layer.

16. A method for forming a wiring structure of a semiconductor device according to claim 15, wherein said steps of forming said metal layer and burying said aperture are performed without breaking a vacuum after said step of forming said second diffusion barrier film.

17. A method for forming a wiring structure of a semiconductor device according to claim 15, further comprising the step of forming a second metal layer after said step (f).

18. A method for forming a wiring structure of a semiconductor device according to claim 15, further comprising a step of
    heat treating said first and second diffusion barrier films before said metal layer forming step.

19. A method for forming a wiring structure of a semiconductor device according to claim 15, further comprising a step of
    heat treating said etched first diffusion barrier film before said second diffusion barrier film forming step.

20. A method for forming a wire of a semiconductor device comprising the steps of:
    forming an insulating layer on a semiconductor substrate;
    forming an aperture on said insulating layer;
    forming a first diffusion barrier film on said insulating layer, on the substrate exposed by said aperture, and on the inner sidewalls of said aperture;
    etching by irradiating a surface of the first diffusion barrier film with plasma, so as to smooth the surface of the first diffusion barrier film formed on the inner sidewalls of said aperture;
    forming a second diffusion barrier film on said etched first diffusion barrier film; and
    performing a high temperature sputtering all over the substrate where said second diffusion barrier film is formed so as to bury said aperture.

21. A method according to claim 6, wherein said diffusion barrier film forming step includes depositing one of a Ti or a TiN layer according to a collimation technique.

22. A method according to claim 21, wherein said diffusion barrier film forming step is performed using a collimator with a size of ⅝ inches and an aspect ratio of 1.5:1.

23. A method according to claim 10, wherein said heat treating step is performed in a nitrogen atmosphere, and a temperature of 450° C.

24. A method according to claim 18, wherein said heat treating step is performed in a nitrogen atmosphere, and a temperature of 450° C.

25. A method according to claim 19, wherein said heat treating step is performed in a nitrogen atmosphere, and a temperature of 450° C.

26. A method according to claim 12, further comprising a step of reducing an overhang phenomenon at the top of said aperture after said metal layer forming step by one of sputtering or collimation, under a condition where working pressure is below 2 mTorr.

27. A method according to claim 12, wherein said metal layer forming step is performed using a DC magnetron device under a condition where the temperature is less than 200° C. and a degree of vacuum is less than $5.0 \times 10^{-7}$ Torr.

28. A method according to claim 12, wherein said metal layer forming step is performed using a DC magnetron device under a condition where the temperature is less than 25° C. and a degree of vacuum is less than $5.0 \times 10^{-8}$ Torr.

29. A method according to claim 15, further comprising a step of reducing an overhang phenomenon at the top of said aperture after said first metal layer forming step by one of sputtering or collimation, under a condition where working pressure is below 2 mTorr.

30. A method according to claim 15, wherein said first metal layer forming step is performed using a DC magnetron device under a condition where the temperature is less than 200° C. and a degree of vacuum is less than $5.0 \times 10^{-7}$ Torr.

31. A method according to claim 15, wherein said first metal layer forming step is performed using a DC magnetron device under a condition where the temperature is less than 25° C. and a degree of vacuum is less than $5.0 \times 10^{-8}$ Torr.

32. A method according to claim 6, wherein said etching step is performed using a ECR plasma device, said etching step further including determining a bias for said substrate to increase a smoothing effect and applying said bias to said substrate.

33. A method for forming a wiring structure according to claim 6, wherein said plasma treatment is an Argon plasma treatment.

* * * * *